United States Patent
Kim et al.

(10) Patent No.: US 7,440,353 B2
(45) Date of Patent: Oct. 21, 2008

(54) FLOATING BODY CONTROL IN SOI DRAM

(75) Inventors: Hoki Kim, Hopewell Junction, NY (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/534,070

(22) Filed: Sep. 21, 2006

(65) Prior Publication Data

US 2008/0084774 A1     Apr. 10, 2008

(51) Int. Cl.
*G11C 7/00*    (2006.01)

(52) U.S. Cl. ............. 365/222; 365/210; 365/233.1

(58) Field of Classification Search ......... 365/222, 365/210, 233.1
See application file for complete search history.

(56) References Cited

U.S. PATENT DOCUMENTS

| | | | | |
|---|---|---|---|---|
| 4,370,737 A | * | 1/1983 | Chan | 365/203 |
| 5,392,240 A | * | 2/1995 | Muraoka | 365/189.01 |
| 5,822,264 A | * | 10/1998 | Tomishima et al. | 365/222 |
| 5,877,978 A | * | 3/1999 | Morishita et al. | 365/149 |

OTHER PUBLICATIONS

Tomishima, S.; Morishita, F.; Tsukude, M.; Yamagata, T.; Arimoto, K.; A Long Data Retention SOI-DRAM With the Body Refresh Function; VLSI Circuits, 1996 Digest of Technical Papersl, 1996 Symposium on Jun. 13-15, 1996 pp. 198-199.*

* cited by examiner

*Primary Examiner*—Huan Hoang
(74) *Attorney, Agent, or Firm*—Scully, Scott, Murphy & Presser, P.C.; Joseph Petrokaitis, Esq.

(57) ABSTRACT

A system and method wherein a DRAM memory device on an integrated circuit (IC) uses a control logic device to initiate a body refresh operation for maintaining a low voltage at a floating body and discourage data loss. A plurality of DRAM cells are connected to a first word line circuit and a first bit line circuit. The control logic device is coupled to the DRAM memory device and the IC for initiating the body refresh cycle. The control logic communicates with a first bit line and word line circuits and communicates with a reference word line and bit line circuits. A sense amplifier circuit and signal is provided for amplifying the voltage at the first bit line and the reference bit line (or bit line bar circuit). The body refresh cycle includes deactivating the first word line voltage while the first bit line and reference bit line voltages continue.

5 Claims, 2 Drawing Sheets

FLOATING BODY CONTROL IN SOI DRAM

FIELD OF THE INVENTION

The present invention relates to semiconductor memory devices, and more particularly, to a dynamic random access memory (DRAM) device having an SOI (Silicon On Insulator) structure in which a memory cell is formed on an insulation layer.

BACKGROUND OF THE INVENTION

Currently, semiconductor dynamic random access memory (DRAM) memory devices are available for silicon on insulator SOI and for complementary metal-oxide semiconductor (CMOS) integrated circuits (IC)s. An SOI type thin film transistor is used as a component in three-dimensional integrated circuits and liquid crystal displays. The SOI type thin film transistor includes a power source/drain region or active region formed at a semiconductor layer on a semiconductor substrate with an insulation film thereunder. In SOI integrated circuits, the active region is isolated from the semiconductor substrate. The SOI type thin film transistor includes a junction capacitance of the active region that is extremely small allowing operation at high speeds with low power consumption. SOI type thin film transistors, such as, metal oxide semiconductor field-effect transistors (thin film SOIMOSFET) may include a 1 G bit (gigabit) DRAM (dynamic random access memory).

U.S. Pat. No. 5,822,264 ('264 patent) to Tomishima et al. discloses a dynamic semiconductor memory device with SOI structure and body refresh circuitry. Essentially, the body refresh operation discharges majority carriers which are stored in a floating body region. A floating body effect is an effect of dependence of the body potential of a transistor. The transistor's body forms a capacitor against the insulated substrate. The charge accumulates on the capacitor and may cause adverse effects, such as, opening of parasitic transistors in the structure and causing off-state leakages, resulting in higher current consumption and in case of a DRAM cell, loss of information from the memory cells. Thus, parasitic floating-body effects are generally associated with partially depleted transistors.

The '264 patent discloses a body refresh function in addition to data refresh operation. The '264 patent discloses a write circuitry including column select circuitry to provide a body refresh potential or GND (ground) to each bit line during the body refresh period.

Typically, high performance DRAM cells with SOI access transistors have a high leakage rate and thereby lose data through sub-threshold leakage. As a result, a ground (GND) pre-charge scheme that keeps the BL/BLB (bit line, and bit line bar) at GND during a retention period will destroy high data (logic 1) on the DRAM cell node. Alternatively, a voltage (VDD) pre-charge scheme that holds BL/BLB at a specified VDD during a retention period can hold data longer. VDD pre-charge can reduce the cell leakage through a surface channel of a cell access transistor while GND pre-charge may loose data during a retention period.

In another example of the VDD pre-charge scheme, the bit line (BL) or bit line bar (BLB) connected to high data containing cells are kept at a pre-charge state (high voltage) until the BL and BLB are pulled down (reduced to zero). When both the bit line and cell node have a high voltage, the potential of the floating body is high. This results in high leakage current when the bit line or bit line bar (reference bit line) is pulled down (reduced to zero). The occurrence of high current leakage may result in data destruction.

Another example of a GND sensing scheme is when the BL or BLB is connected to high data containing cells which keeps the pre-charge state, i.e. GND level, without toggling. This scenario results in continuous leakage and results in lower data retention time.

However, in a VDD (voltage) pre-charge scheme in which the BL or BLB keeps the VDD level while maintaining high data on a cell node, the floating body is charged to a high voltage due to junction leakage current from the source and drain of the cell access transistor. Assuming a long enough time to charge the floating body, floating body potential can be close to VDD. This leads to destruction of the stored data because the increased floating body increases channel leakage. Therefore, keeping body potential at a low level is desirable for a VDD pre-charge scheme.

In a OND pre-charge scheme, the pre-charge state of BL is GND and is intended to automatically refresh the body. However, both OND and VDD pre-charge schemes increase the body potential and lead to short retention of data. The VDD pre-charge scheme prevents high data loss while the BL is in pre-charge state, but requires refreshing the floating body to achieve data retention. Thus, data in a typical DRAM cell is susceptible to leakage resulting in loss of data. It would therefore be desirable to solve the problem of retention of data in a SOI-DRAM cell on an integrated circuit.

SUMMARY OF THE INVENTION

The invention relates to a DRAM memory device for use in an integrated circuit (IC) which comprises a memory array. The memory array includes a plurality of first DRAM cells connected to a first word line circuit and a bit line circuit or bit line bar circuit. A plurality of second DRAM cells are connected to the bit line circuit or bit line bar circuit and a second word line circuit. A plurality of reference DRAM cells are connected to a reference word line circuit and the bit line circuit or bit line bar circuit. A first power supply supplies a voltage to the DRAM cells, the bit line circuit, and the first word line. A second power supply for supplying a reference voltage to the reference DRAM cells and reference bit line circuit wherein the reference bit line voltage is different from the bit line voltage. Control logic is coupled to the DRAM memory device and the IC for providing normal DRAM cycle operation and initiating a body refresh cycle. The control logic generates a word line signal, a bit line control signal, a bit line bar control signal, and a reference word line signal. A sense amplifier circuit amplifies the signal voltage at the bit line circuit and the bit line bar circuit. The control logic is adapted to generate a body refresh cycle periodically wherein the voltage supplied to the first word line is deactivated while the bit line and bit line bar voltages continue, and the control logic is adapted to re-activate the first word line voltage. In a related aspect of the invention, the reference word line circuit and bit line circuit communicate with the first word line circuit.

In a further aspect of the invention, a method for a body refresh cycle of a DRAM memory device coupled to an integrated circuit (IC) comprises providing a word line signal, a bit line signal, a bit line bar signal, a sense amplifier signal, and a control signal for initiating the body refresh cycle. A body refresh cycle is initiated via the control signal and the word line signal is deactivated. The bit line voltage signal continues, and the word line signal is re-activated.

In a related aspect of the invention the word line signal is deactivated for a short duration, e.g., two clock cycles, such that the first cycle refreshes the bit line and the second cycle refreshes the bit line bar.

BRIEF DESCRIPTION OF THE DRAWINGS

These and other objects, features and advantages of the present invention will become apparent from the following detailed description of illustrative embodiments thereof, which is to be read in connection with the accompanying drawings, in which.

DETAILED DESCRIPTION OF THE INVENTION

An embodiment of the present invention is described herein with reference to the accompanying drawings. In general, transistors used in the embodiment described herein may be formed on a single semiconductor substrate such as that made of a single crystal silicon by known integrated circuit technologies such as a CMOS transistor (complementary metal-oxide semiconductor) and the like, or silicon on insulator (SOI) techniques.

The present invention provides a system and method for implementing a floating body refresh cycle for a VDD or VDD/2 (half of the VDD) pre-charge scheme. The present invention may be used with high leakage, high performance silicon on insulator (SOI) dynamic random access memory (DRAM) cell design. A DRAM cell typically has a read/write operation and a data refresh operation. The present invention adds a body refresh operation whereby the floating body is refreshed. When the floating body is not refreshed and the voltage is maintained at a specified amount, cell data loss can occur. Thus, the present invention provides a means for maintaining a low voltage at the floating body and thus prevents cell data loss.

To protect cell data in conditions where there exists high leakage rate of transistors, the present invention provides a floating body refresh system or method. Generally, the present invention provides, a body refresh, i.e., to refresh a floating body by pulling down the floating body close to ground level. The floating body is refreshed by using a signal to initiate a body refresh function. A body refresh function improves a data refresh of dynamic random access memory (DRAM) memory. According to an embodiment of the present invention, one body refresh cycle refreshes half the bit line in a cell array. Thus, the refresh cycle requires only two body refresh cycles per array during the body refresh period, and thereby, memory availability is increased and refresh power is reduced.

Figures 1, 2:
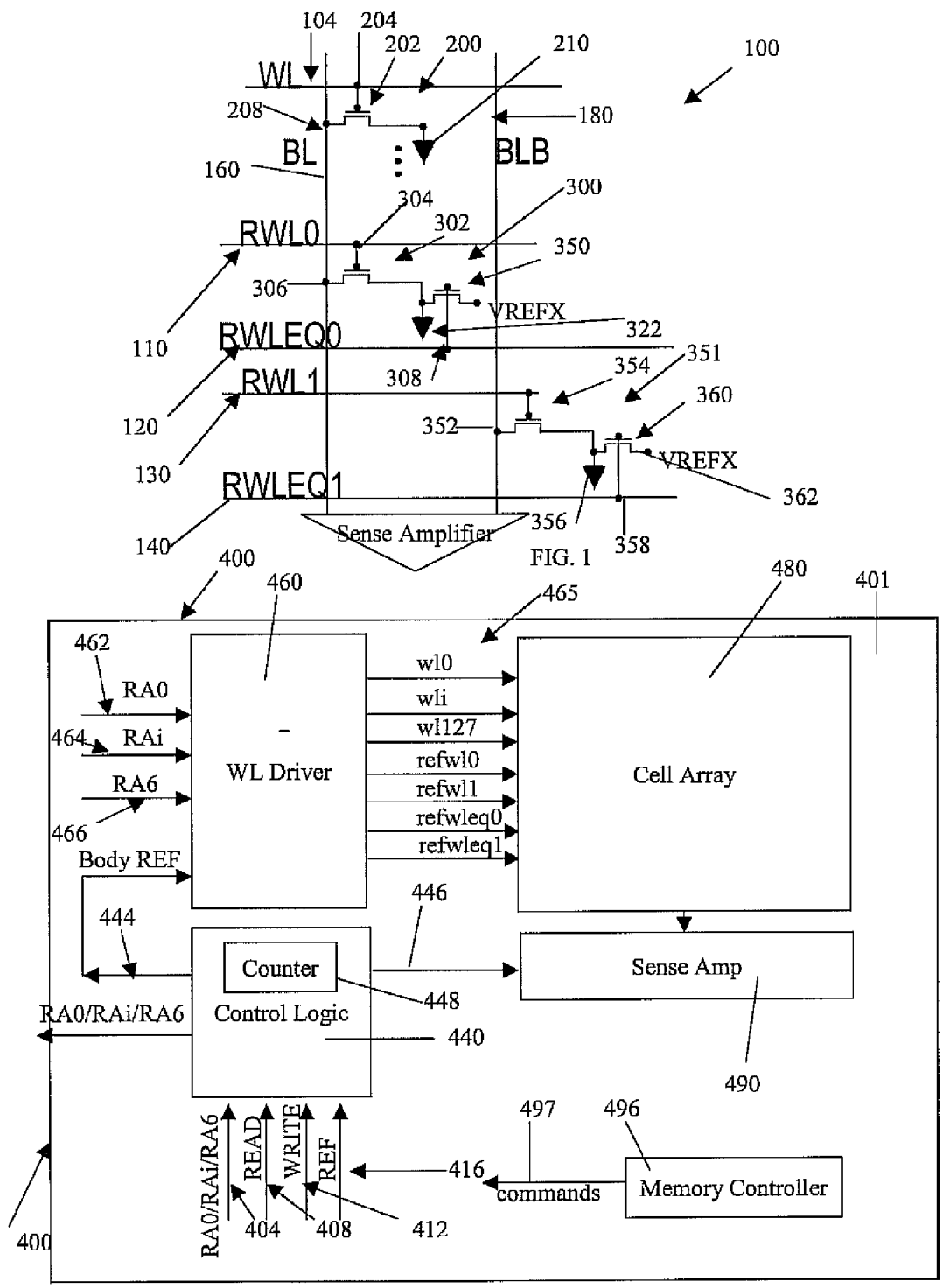
FIG. 1 is an exemplary schematic diagram of a DRAM cell.
FIG. 2 is an exemplary block diagram of a DRAM system.

Referring to FIG. 1, an example DRAM (dynamic random access memory) cell circuit design 100 is shown which is part of the DRAM memory device on an integrated circuit (IC or chip) 401 (shown in FIG. 2). The DRAM cell 100 includes a word line circuit (WL) 104 which may be connected to a plurality of cells. A voltage power source from the IC 401 (shown in FIG. 2) is connected to the DRAM cell 100 and supplies power to the WL 104 and a bit line circuit (BL) 160. Access to the cell 100 is enabled by the WL 104. The counter 448 (shown in FIG. 2) counts the body refresh interval by using a normal refresh command.

The DRAM cell 100 includes a memory cell circuit 200 having a transistor 202, and reference cells 300, 351. In memory cell 200, transistor 202 is connected to the WL 104 at node 204. A capacitor 210, for storing data, is connected to the BL 160 at node 208.

A multiplicity of memory cells 100 comprise a memory cell circuit array 480 (shown in FIG. 2). For VDD sensing, reference cells are grouped to make the reference word line (RWL0) 110. The body refresh cycle according to the invention uses reference cells to refresh the floating body by deactivating or pulling down to ground, i.e. "0" voltage, the bit line (BL) 160 or bit line complement or bar (BLB) 180, respectively. The body refresh command is generated internally by using a counter 448 which is part of control logic 440 (shown in FIG. 2).

Referring to FIG. 1, reference cell circuit 300 includes a transistor 302 connected to the reference write line (RWL0) 110 at node 304 and to the BL 160 at node 306. Transistor 350 is connected to the line RWLEQ0 120 at node 308. A capacitor 322 is positioned between the transistors 302 and 350. Reference cell 351 includes transistors 354 and 360. The transistor 354 is connected to the BL 160 at node 352 and the RWLEQ1 140 at 358. A capacitor 356 is positioned between the transistors 354 and 360. A reference cell circuit 351 includes a capacitor 356 and the transistor 354 is connected to the BLB at node 352. VREFX 362, reference voltage (second power supply), is connected to transistor 360.

Referring to FIG. 2, a block diagram 400 is shown depicting the components of an embodiment of the present invention. The IC 401 includes a control logic 440 having a counter 448 and inputs 404, 408, 412, and 416. Input 404 is a row address to activate a word line. Input 408 is a read command, input 412 is a write command, and input 416 is a refresh command. The commands 497 are from a memory controller 496 on the chip 401.

A body refresh signal 444 is initiated by the control logic 440 to the WL driver 460. A signal 446 is also initiated by the control logic to the sense amplifier 490. The sense amp 490 amplifies the small signal at the bit line 160 and bit lineB 180.

The WL driver 460 has inputs 462, 464, and 466. Input 462 is a row address 0 (the least significant bit). Input 464 is a row address "i", indicating a finite number of inputs ("i"th row address bit). Input 466 is a row address six (6) (the most significant bit). The WL driver 460 provides for signals 465 to the cell array 480. The signals 465 are connected to the cells. The cell array 480 comprises a matrix of DRAM cells as depicted in FIG. 1.

Figure 3:
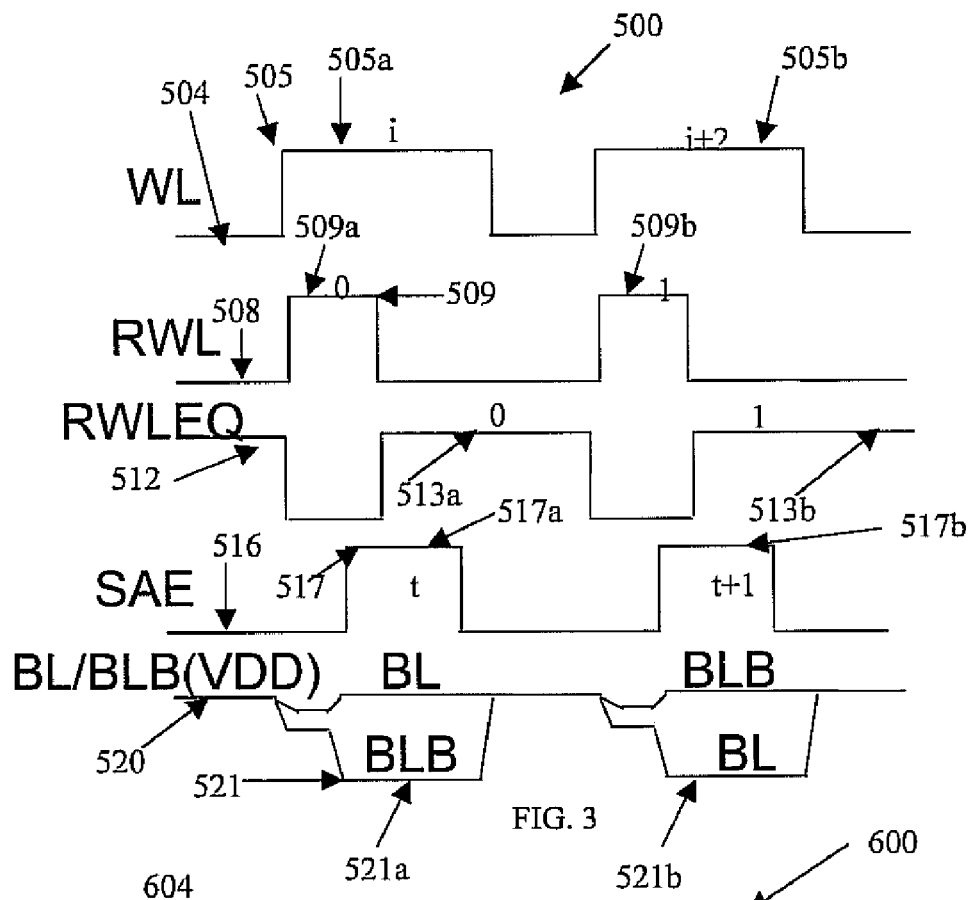
FIG. 3 is a signal diagram before implementing the refresh mode according to the present invention.

FIG. 3 shows DRAM cell signals 500 during normal access. The BL and BLB signals 520 are at a high level and cannot be discharged without losing data in a DRAM cell. The WL signal 504 is activated and displays a normal signal at a specified voltage level 505 at steps 505a and 505b. Step 505a and step 505b activate the word line t=i and t=i+2. Simultaneously, the RWL signal 508, RWLEQ signal 512 at step 509a and 509b are activated corresponding to the two different word line locations i and i+2, and SAE signal 516, i.e. sense amplifier enabling signal, is activated to amplify a normal signal. The RWL signal 508 reaches voltage level 509 enabling RWL0 at 509a and reaches voltage level 509 enabling RWL1 at 509b. The RWLEQ signal 512 enables RWLEQ0 at 513a and RWLEQ1 at 513b. The SAE signal 516 reaches a specified voltage 517 at "t" 517a and "t+1" 517b. The BL/BLB (Vdd) signal 520 reaches a specified voltage 521 at "t" 521a and "t+1" 521b.

Figure 4:
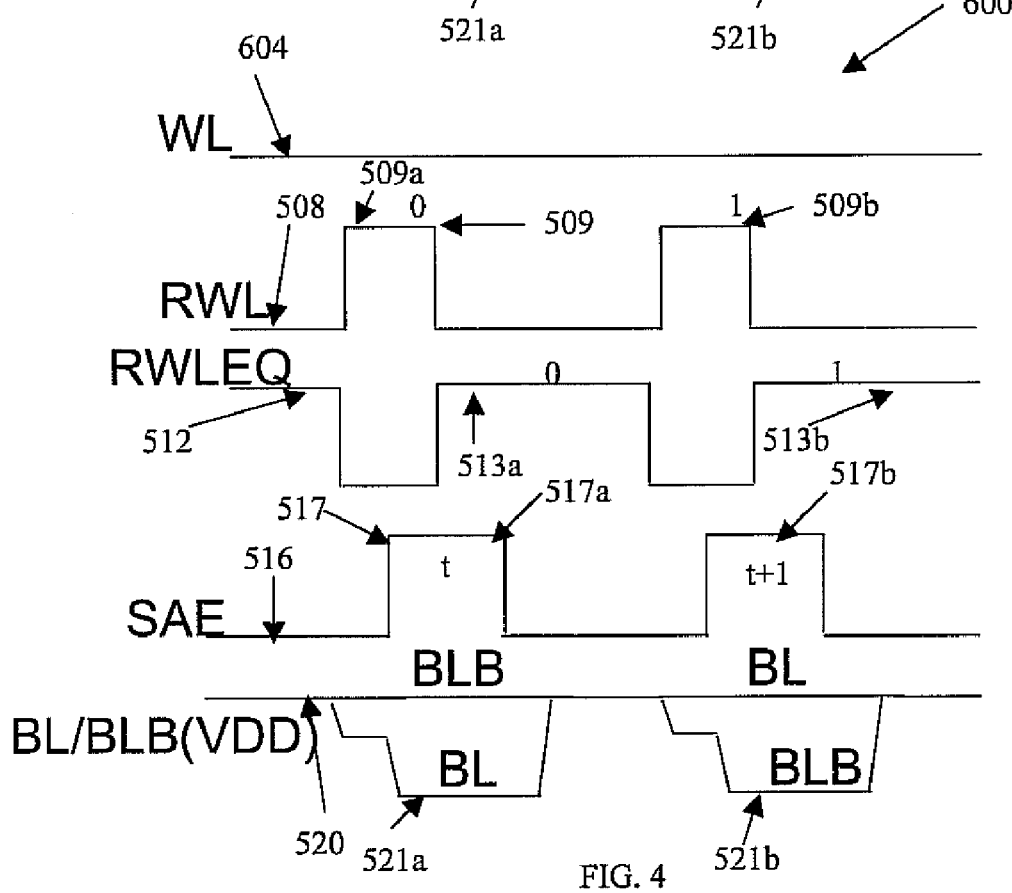
FIG. 4 is a signal diagram during the refresh mode according to the present invention.

Referring to FIG. 4, the DRAM cell 100 (shown in FIG. 1) is in body refresh cycle or body refresh mode. The WL signal 604 is deactivated, i.e., the voltage is "0" or grounded. The RWL signal 508 and RWLEQ signal 512, and SAE signal 516 continue to be activated as the DRAM cell is in body refresh mode, as shown in FIGS. 3 and 4. After the body refresh mode is complete, the control logic 440 (shown in FIG. 2) reactivates the WL and the cell signals return to those shown in FIG. 3. In the DRAM cell 100 (shown in FIG. 1), half of the cell is connected to the bit line 160 (BL) and half of the cell 100 is connected to the bit line bar 180 (BLB). In a first cycle, the BLB pulled down to ground, i.e. "0" voltage. In a second cycle the BL is pulled down to ground, i.e., "0" voltage. Thus, the body is refreshed in two cycles, one half of the cell 100 in each cycle.

Thus, during a typical DRAM cell read write operation and a data refresh operation, the present invention adds a body refresh operation whereby the floating body is refreshed. Thus, the present invention provides a means for maintaining a low voltage at the floating body and discourage data loss.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A DRAM memory device on an integrated circuit (IC), which comprises:
 a memory array including a plurality of first DRAM cells connected to a first word line circuit and a bit line circuit or bit line bar circuit;
 a plurality of second DRAM cells are connected to the bit line circuit or bit line bar circuit and a second word line circuit;
 a plurality of reference DRAM cells connected to a reference word line circuit and the bit line circuit or bit line bar circuit;
 a first power supply for supplying a voltage to the DRAM cells, the bit line circuit, and the first word line;
 a second power supply for supplying a reference voltage to the reference DRAM cells and the bit line bar circuit wherein the reference bit line voltage is different from the bit line voltage;
 control logic communicating with the DRAM memory device and the IC for providing normal DRAM cycle operation and initiating a body refresh cycle, and during the body refresh cycle the control logic generates a word line signal, a bit line control signal, a bit line bar control signal, and a reference word line signal;
 a sense amplifier circuit which amplifies the signal voltage at the bit line circuit and the bit line bar circuit; and
 the control logic being configured to generate the body refresh cycle periodically wherein the voltage supplied to the first word line is deactivated while the bit line and bit line bar voltages continue and the control logic is configured to re-activate the first word line voltage, and the word line signal is deactivated for two clock cycles such that the first cycle refreshes the bit line circuit and the second cycle refreshes the bit line bar circuit.

2. The device of claim 1 wherein the reference word line circuit and bit line circuit communicate with the first word line circuit.

3. The device of claim 1 wherein the control logic communicates to the sense amplifier circuit to amplify the signal voltage.

4. A method for providing a body refresh cycle of a DRAM memory device coupled to an integrated circuit (IC) comprising:
 connecting a plurality of DRAM cells to a first word line circuit and a bit line circuit or a bit line bar circuit;
 connecting a plurality of reference DRAM cells to a reference word line circuit and the bit line circuit or the bit line bar circuit;
 supplying a first voltage to the DRAM cells, the bit line circuit and the first word line;
 supplying a reference voltage to the reference DRAM cells and the bit line bar circuit;
 generating a word line signal;
 generating a bit line signal;
 generating a bit line bar signal and a reference world line signal;
 generating a sense amplifier signal;
 generating a control signal for initiating a body refresh cycle;
 initiating the body refresh cycle via the control signal;
 deactivating the word line signal for two clock cycles such that the first cycle refreshes the bit line circuit and the second cycle refreshes the bit line bar circuit;
 continuing the bit line and bit line bar voltage signals; and
 re-activating the word line signal.

5. The method of claim 4 further providing a control logic device which generates the control signal for initiating a body refresh cycle, and the control logic device generating the word line signal, the bit line signal, the bit line bar signal, and initiating the sense amplifier signal.

* * * * *